(12) United States Patent
Dodd et al.

(10) Patent No.: US 8,153,095 B2
(45) Date of Patent: Apr. 10, 2012

(54) METHOD FOR PRODUCING HIGHLY PURE SOLUTIONS USING GASEOUS HYDROGEN FLUORIDE

(75) Inventors: Michael A. Dodd, Chandler, AZ (US); John McFarland, Scottsdale, AZ (US); Wolfgang Sievert, Wunstorf (DE)

(73) Assignee: Honeywell International Inc., Morritown, NJ (US)

( * ) Notice: Subject to any disclaimer, the term of this patent is extended or adjusted under 35 U.S.C. 154(b) by 908 days.

(21) Appl. No.: 10/455,067

(22) Filed: Jun. 5, 2003

(65) Prior Publication Data

US 2004/0075078 A1    Apr. 22, 2004

Related U.S. Application Data

(63) Continuation-in-part of application No. 10/240,230, filed as application No. PCT/EP00/02763 on Mar. 29, 2000, now abandoned.

(60) Provisional application No. 60/386,372, filed on Jun. 5, 2002.

(51) Int. Cl.
    *C01B 7/19*    (2006.01)
(52) U.S. Cl. ........ 423/483; 423/470; 423/471; 423/484; 216/104
(58) Field of Classification Search .................. 423/483, 423/484, 470, 466; 216/104
    See application file for complete search history.

(56) References Cited

U.S. PATENT DOCUMENTS

| | | | | |
|---|---|---|---|---|
| 3,979,241 A | | 9/1976 | Maeda et al. | 156/13 |
| 4,087,367 A | * | 5/1978 | Rioult et al. | 252/79.1 |
| 4,230,523 A | | 10/1980 | Gajda | 156/657 |
| 4,269,654 A | | 5/1981 | Deckert et al. | 156/657 |
| 4,343,677 A | * | 8/1982 | Kinsbron et al. | 438/704 |
| 5,320,709 A | | 6/1994 | Bowden et al. | 156/667 |
| 5,336,356 A | | 8/1994 | Ban et al. | |
| 5,348,627 A | * | 9/1994 | Propst et al. | 205/655 |
| 5,478,436 A | * | 12/1995 | Winebarger et al. | 438/693 |
| 5,722,442 A | * | 3/1998 | Hoffman et al. | 134/102.1 |
| 5,846,387 A | * | 12/1998 | Hoffman et al. | 203/40 |
| 6,050,283 A | * | 4/2000 | Hoffman et al. | 137/3 |
| 6,117,796 A | * | 9/2000 | Gale et al. | 438/756 |
| 6,276,379 B1 | * | 8/2001 | Seto et al. | 134/182 |
| 6,350,425 B2 | * | 2/2002 | Hoffman et al. | 423/470 |
| 6,391,119 B1 | * | 5/2002 | Lee et al. | 134/3 |
| 6,534,459 B1 | * | 3/2003 | Yata et al. | 510/176 |
| 2004/0075078 A1 | | 4/2004 | Sievert et al. | |

FOREIGN PATENT DOCUMENTS

| | | |
|---|---|---|
| CA | 2 368 441 A | 10/2000 |
| CH | 664978 | 4/1988 |
| DE | 281 173 | 8/1990 |
| DE | 199 14 243 | 10/2000 |
| EP | 0 679 607 | 11/1995 |
| EP | 0 887 323 | 12/1998 |
| WO | WO 97/02958 | 1/1997 |
| WO | WO 00/58208 | 10/2000 |
| WO | 03/104144 A | 12/2003 |

\* cited by examiner

*Primary Examiner* — Ngoc-Yen Nguyen

(57) ABSTRACT

Methods for producing highly pure solutions containing hydrogen fluoride, one or more salts thereof or a mixture of two or more thereof, by adding hydrogen fluoride to at least one anhydrous solvent, wherein the hydrogen fluoride is added to the anhydrous solvent or solvents in the form of a gas or as a liquified gas or as a mixture of gas and liquefied gas. High purity hydrogen fluoride and ammonium fluoride solutions produced by the inventive method are also disclosed.

17 Claims, No Drawings

METHOD FOR PRODUCING HIGHLY PURE SOLUTIONS USING GASEOUS HYDROGEN FLUORIDE

CROSS-REFERENCE TO RELATED APPLICATIONS

The present application is a Continuation-In-Part of U.S. patent application Ser. No. 10/240,230 filed under 35 U.S.C. §371 as a United States National Phase Application of International Application PCT/EP00/02763 filed Mar. 29, 2000 that, in turn, claims priority benefit of German Application No. DE 199 14 243.2 filed Mar. 29, 1999. The disclosures of both priority applications are incorporated by reference. The present application also claims priority benefit under 35 U.S.C. §19(e) of U.S. Provisional Patent Application No. 60/386,372 filed Jun. 5, 2002, the disclosure of which is also incorporated by reference.

BACKGROUND OF THE INVENTION

The present invention relates to a method for producing a highly pure solution containing hydrogen fluoride (HF), a salt thereof, or a mixture thereof, wherein hydrogen fluoride is introduced into an anhydrous solvent as a gas and/or as a liquefied gas.

The electronics and semiconductor industries, among others, require highly pure process solutions. Among these solutions, are solutions containing HF, HF salts or mixtures thereof, with or without other ingredients.

Ammonium fluoride solutions, for which among the highest purity requirements are imposed, are generally produced by dissolving crystalline ammonium fluoride in the corresponding solvent, as is e.g. described in U.S. Pat. No. 5,320,709. One disadvantage of this method is that metallic impurities are generally within the ppm range, and the solutions are therefore inappropriate for fields of use having stricter purity requirements for metal content. The additional purification of crystalline ammonium fluorides necessary for producing highly pure solutions with a substantially lower metal content is, however, difficult.

A further disadvantage is that it is very difficult in manufacturing to obtain reproducible concentrations of free hydrogen fluoride in the ammonium fluoride solutions from batch to batch. For some industrial applications, however, constant free hydrogen fluoride content is crucial.

There remains a need for solutions of hydrogen fluoride and hydrogen fluoride salts having greater purity and for solutions of hydrogen fluoride salts in which the concentration of free hydrogen fluoride remains relatively constant from batch to batch.

SUMMARY OF THE INVENTION

This need is met by the present invention. The present invention provides a method by which solutions of hydrogen fluoride and salts thereof may be prepared with heretofore-unattained levels of purity.

Therefore, according to one aspect of the present invention, a method is provided for producing highly pure solutions containing hydrogen fluoride or one or more salts thereof, alone or in combination, in which by passing hydrogen fluoride into at least one anhydrous solvent, wherein the hydrogen fluoride is introduced as a gas and/or liquefied gas into the anhydrous solvent or solvents.

Any anhydrous solvent in which hydrogen fluoride is soluble can be used as the anhydrous solvent. Generally, these are polar anhydrous solvents. Thus, the present invention includes a method as described above, wherein at least one anhydrous solvent is a polar solvent.

The inventive method also includes embodiments in which highly pure solutions are produced, wherein at least one other component is used in addition to hydrogen fluoride and the anhydrous solvent or solvents.

Accordingly, the present invention also relates to a method as described above, wherein at least one other gas or at least one other liquid or at least one solid or a mixture of two or more thereof in addition to hydrogen fluoride is introduced into the anhydrous solvent or solvents.

In preferred aspects of this embodiment of the inventive method, ammonia is the component used in addition to hydrogen fluoride, whereby an ammonium fluoride solution is produced.

Thus, the present invention also relates to a method for preparing a highly pure ammonium fluoride solution, as described above, wherein ammonia is used as an additional component. While it is possible in principle to use liquid ammonia, gaseous ammonia is preferred.

In another preferred aspect of this embodiment of the inventive method, the additional component is another gas used as a reactive gas in etching. Examples are, among others, hydrogen chloride and hydrogen bromide.

Accordingly, the present invention also relates to a method, as described above, wherein gaseous hydrogen chloride or gaseous hydrogen bromide or a mixture thereof is used as an additional component. In methods according to the present invention, the stoichiometric ratio of hydrogen fluoride to hydrogen chloride and/or hydrogen bromide is preferably less than or equal to 1, and more preferably less than 1.

The present invention also includes highly pure solutions of hydrogen fluoride or one or more salts thereof, such as ammonium fluoride, alone or in combination, and optionally containing additional components, produced in accordance with the above-described method.

The hydrogen fluoride is added as an anhydrous gas and/or liquified gas to the anhydrous solvents or solvents by essentially conventional means. In a preferred embodiment, the anhydrous solvent or solvents are placed in an appropriate container. The container materials can be made of essentially any material appropriate for contact with hydrogen fluoride and free of impurities, to guarantee high purity of the resulting solution. Containers are preferred that have inner walls contacting the highly pure solution that are made of metal-free polymers such as HDPE, PFA, polypropylene, PVDF, and perfluorinated polyethylene propylene (FEP).

Unstabilized HD-polyethylenes, such as HD-polyethylenes with a specific density of 0.940-0.970 g/cm$^3$, in particular 0.942-0.961 g/cm$^3$, are among the polymers that are suitable. This includes polyethylenes distributed under the trademark Lupolen®, such as Lupolen® 6021D, Lupolen® 5021D, Lupolen® 4261AQ149, and Lupolen® 4261AQ135. The containers used in the method of the invention can consist of one or more layers, wherein the one or more external layers that do not contact the solutions can be made of essentially any material.

The lines delivering hydrogen fluoride as gas and/or liquified gas into the container wherein the anhydrous solvent or solvents are placed can also consist of essentially any appropriate material. Hose couplings made of highly pure PFA are preferably used in the method of the invention.

Should the gaseous hydrogen fluoride be liquified according to the method of the present invention prior to being added to the anhydrous solvent or solvents, this liquefaction can be performed be essentially any conventional means.

If, according to the method of the present invention, the hydrogen fluoride is added to the anhydrous solvent or solvents in gaseous form as well as in the form of a liquefied gas, it is possible to first introduce gaseous and then liquefied hydrogen fluoride. It is also possible to first introduce liquefied and then gaseous hydrogen fluoride. It is still further possible to simultaneously introduce gaseous and liquefied hydrogen fluoride, wherein the gaseous and liquefied hydrogen fluoride can be combined prior to introduction.

According to the method of the present invention, it is possible to bring the hydrogen fluoride, introduced as a gas and/or liquefied gas into the anhydrous solvent or solvents, to a predetermined temperature prior to introduction. It also is possible to bring the anhydrous solvent or solvents to a predetermined temperature prior to introduction. The solution may also be brought to a predetermined temperature and/or held at a predetermined temperature during the introduction of the hydrogen fluoride into the anhydrous solvent or solvents. The temperature adjustment may be performed by essentially conventional means.

During the addition of hydrogen fluoride into the anhydrous solvent or solvents, it is possible to homogenize the solution by essentially conventional techniques. In a preferred embodiment of the present invention, the solution is recirculated via one or more pump-over lines after finishing the addition the hydrogen fluoride.

In a preferred embodiment of the method of the invention, the anhydrous solvent or solvents are chosen from polyols, carboxylic acids, derivatives of carboxylic acids, organic sulfur compounds, aliphatic or aromatic nitrogen compounds, and mixtures of two or more thereof.

Among others, examples of polyols include ethylene glycol, propylene glycol, polymethylene glycol, polyethylene glycol and glycerol. In particular polyols with relatively low viscosity are preferred. Further, polyalkylene glycols, in particular polyethylene glycols with a number-average molecular weight of 250 to 6,000 are also preferred, and more preferably have a molecular weight of 250 to under 5,000 and in particular 250 to 1,000.

The carboxylic acids include aliphatic, cycloaliphatic and aromatic acids that are liquid at ambient conditions, and may have one or more acid groups. Among others, examples include formic acid, acetic acid and propionic acid. Acid derivatives of carboxylic acid such as their esters or their amides are also appropriate solvents. It is further possible to use acrylic derivatives the carboxylic acids or the carboxylic-acid derivatives. Hydroxyl groups and halogens are included among possible substituents. Amino carboxylic acids are also included among the possible solvents.

Anhydrous organic sulfur compounds, such as sulfates, sulfonates, sulfoxides, sulfones, or sulfites are also appropriate solvents, including, DMSO, dimethyl sulfite, diethyl sulfite, glycol sulfite, dimethyl sulfone, diethyl sulfone, dipropyl sulfone, dibutyl sulfone, tetramethylene sulfone, methyl sulfolane, diethyl sulfoxide, dipropyl sulfoxide, dibutyl sulfoxide, tetramethylene sulfoxide, ethyl methane sulfonate, 1,4-butane diolbis(methane sulfonate), diethyl sulfate, dipropyl sulfate, dibutyl sulfate, dihexyl sulfate, dioctyl sulfate, and the like.

Furthermore, ethylene carbonate, propylene carbonate, dimethyl carbonate, diethyl carbonate, dipropyl carbonate, diisopropyl carbonate, dibutyl carbonate are also appropriate anhydrous solvents for use in the method of the invention.

Anhydrous aliphatic compounds, substituted so that hydrogen fluoride is soluble therein, can also be used as solvents Halogen substituents are mentioned as possible substituents, among others.

Another group of possible solvents are aliphatic and aromatic amines, which may be substituted, for example, amino alcohols such as ethanolamine.

According to the method of the invention the hydrogen fluoride may first be added to a part of the anhydrous solvent or solvents, to which further solvent is added after introduction.

In the case that two or more different anhydrous solvents are used in the method of the invention, hydrogen fluoride may be added first to one or more of these solvents, and then one or more of the other solvents is added to the resulting mixture. It is also possible to produce two or more solutions of hydrogen fluoride as per the above described method and then subsequently combine the two or more solutions.

When the additional component or components do not react with hydrogen fluoride, the order of introduction is not critical. The additional component or components may be introduced into the solution of hydrogen fluoride in the anhydrous solvent. It is also possible to first combine the anhydrous solvent or solvents with the additional component or components and then add hydrogen fluoride. Furthermore, it is possible to introduce the additional component or components together with the hydrogen fluoride into the anhydrous solvent or solvents. If need be, the hydrogen fluoride can be mixed with at least one additional component prior to addition to the anhydrous solvent or solvents, and the resulting mixture can then be added to the anhydrous solvent or solvents.

When the additional component is ammonia, the one anhydrous solvent or solvents may be contacted with the desired amount of gaseous hydrogen fluoride, after which the corresponding amount of gaseous ammonia is added to it. It is also possible to first contact the solvent or solvents with the desired amount of gaseous ammonia and then introduce the corresponding amount of gaseous hydrogen fluoride. The two gaseous components may also be introduced into the solvent or solvents simultaneously and spatially separated. It is also possible to introduce one of the two gaseous components and then to start the introduction of the other gaseous component after a certain time.

In a particularly preferred embodiment of the present method, the anhydrous solvent or solvents are first treated with the desired amount of gaseous hydrogen fluoride and this solvent is recirculated, as described above. Then, gaseous ammonia is introduced into this homogenized solution and the resulting solution is in turn recirculated by pumping over and thus homogenized.

The temperature in the reaction container is controlled so that during introduction of the gaseous ammonia it does not exceed a maximum of 35° C., preferably a maximum of 30° C., and particularly preferably is less than 30° C.

The concentration of the highly pure solutions of ammonium fluoride which are produced according to the method of the invention are essentially only dependent on the solubility of ammonium fluoride in the solvent or solvents and can be any level within this framework. It is also possible to produce saturated solutions of ammonium fluoride in the solvent or solvents, and it is also possible that such an amount of ammonia and hydrogen fluoride are introduced that ammonium fluoride precipitates as a solid.

In a preferred embodiment of the present invention, highly pure solutions of ammonium fluoride are produced in the solvent or solvents according to the method of the invention, the concentration of which generally ranges from 0.1 to 50 weight percent, preferably from 1 to 30 weight percent, and particularly preferably from 2.5 to 10 weight percent.

In order to avoid the creation of explosive ammonia-air mixtures, inert atmospheres may be employed in and around the container, wherein the gaseous ammonia is added to the anhydrous solution or solutions, into which hydrogen fluoride may already have been dissolved. Essentially any inert gas such as, among others, nitrogen or argon is appropriate. Preferably, the container atmosphere is rendered inert prior to filling with solvents and, if necessary, hydrogen fluoride.

In principle, all of the above-described solvents can be used as solvents in which the ammonium fluoride is produced. In a preferred embodiment, anhydrous polyols are used, and in a particularly preferred embodiment anhydrous ethylene glycol is used.

The present invention also provides a method allowing for the production of highly pure ammonium fluoride solutions, having a constant content of free hydrogen fluoride that can reproducibly be set. The content of free hydrogen fluoride contained in the highly pure ammonium fluoride solutions produced according to the present invention can be set by simple stoichiometric addition of the gaseous hydrogen fluoride and the gaseous ammonia into the solvent or solvents. The exact measurement permitted by the use of gaseous components, makes it possible to produce highly pure solutions with a precisely defined content of free hydrogen fluoride that can be accurately reproduced. In particular, highly pure solutions of ammonium fluoride can be produced, having less that 0.01 weight percent free hydrogen fluoride.

The hydrogen fluoride solutions made by the method of the present invention are used in etching processes. The method of the present invention can be used to prepare solutions meeting etching process purity requirements. The method of the present invention can also be used to produce solutions with heretofore-unknown concentrations of hydrogen fluoride. Preferred solutions according to the present invention contain from about 10 to about 35 weight percent hydrogen fluoride.

In principle, all of the above-mentioned anhydrous solvents can be used for this embodiment of the method in accordance with the present invention, provided that the additional gaseous component or components are soluble in the solvent or solvents. In preferred embodiments, acetic acid or a mixture of acetic acid and acetic ester, or a mixture of DMSO and DMA are used as the anhydrous solvents. If a mixture of DMSO and DMA is used, the stoich-iometric mixing ratio of DMSO and DMA is in the range of from about 30:70 to about 70:30. In a particularly preferred embodiment of the present invention, highly pure solutions of hydrogen fluoride are produced in a DMSO/DMA mixture, wherein hydrogen fluoride, DMSO, and DMA have the same weight portions.

When the additional component is another reactive gas used in etching, such as hydrogen chloride or hydrogen bromide, the order of adding the gases to the anhydrous solvent or solvents is not critical. It is possible to add the gases into the anhydrous solvent or solvents in sequence or simultaneously, and, if necessary, spatially separated or together in one feeder. It is further possible to liquefy the other gaseous component or components prior to addition into the anhydrous solvent or solvents accordance to conventional techniques such as the methods referred to above for the introduction of hydrogen fluoride, and to introduce the liquefied gas or gases into the anhydrous solvent or solvents.

It is also possible according to the method of the present invention to introduce gaseous hydrogen chloride and/or gaseous hydrogen bromide besides gaseous hydrogen fluoride and gaseous ammonia into the anhydrous solvent or solvents. The order of introducing the individual components is in principle not limited.

The field of use of the highly pure solutions or the present invention, wherein at least one further reactive gas is also used as a component in addition to gaseous hydrogen fluoride, is not limited to the above-mentioned etching.

The term "purity" as used herein relates to all possible impurities that a solution, made in accordance with the present invention, can have. Among others, metal ions, halogenides such as chloride or bromide, further anions such as nitrate, phosphate or sulfate, organic compounds, generally particular impurities, viruses, bacteria, and their by-products, such as endotoxines or mycotoxines, are all included among the possible impurities.

The term "highly pure" as used herein denotes degrees of purity regarding a certain impurity, being in a range of less than 1 ppb.

Highly pure solutions can be made in accordance with the method of the present invention that are highly pure with regard to all possible impurities. In a preferred embodiment of the method of the present invention, highly pure solutions are made which have a very low content of metal ions.

According to the method of the present invention, components are used that have a degree of impurity regarding all possible impurities that is so low that the highly pure solutions can be produced from the components without a further purifying step and with the purity required by the user.

According to the degree of purity required for the highly pure solution to be produced, it is possible according to the method of the present invention to use highly pure hydrogen fluoride gas and/or one or more highly pure solvents. When at least one additional component as described above is used, this component can also be highly pure.

With regard to producing the highly pure solutions that, as described above, have very low contents of metal ions, methods according to the present invention use gaseous hydrogen fluoride, the metal-ion content of which is lower than 1 ppb, preferably lower than 100 ppt.

Examples of metals, with reference to which the solutions made in accordance with the present invention are highly pure, are, among others, aluminum, antimony, arsenic, barium, beryllium, lead, cadmium, calcium, chromium, iron, gallium, germanium, gold, indium, potassium, cobalt, copper, lithium, magnesium, manganese, molybdenum, sodium, nickel, platinum, silver, silicon, strontium, thallium, titan, vanadium, bismuth, zinc, tin, or zirconium.

Depending upon the required purity of the solution to be made, it is possible, if necessary, to lower the impurity content of the anhydrous solvent or solvents in accordance with conventional prior art methods, so that it ranges lower than 1 ppb, and preferably lower than 100 ppt. In particular, distillation methods can be used to purify the anhydrous solvent or solvents, such as by means of common distillation or by distillation using microwave radiation.

Accordingly, the present invention thus also provides highly pure solutions having a metal-ion content of less than 100 ppt per metal. The highly pure solutions made in accordance with the present invention can be used in all possible applications where solutions of hydrogen fluoride or one or more salts thereof, alone or in combination, are used. In particular, applications are found in the field of semi-conductors and in the electronics industry, and in analytical chemistry, as well as in (bio)pharmaceuticals.

The highly pure solutions made in accordance with the method of the present invention are particularly well suited for use as etching agents. Herein the fact that the hydrogen fluoride content of the highly pure ammonium fluoride solutions of the present invention can be consistently reproduced in production is particularly advantageous. This makes it possible to provide an extremely narrow process window for the etching rate of the solution.

In particular, the highly pure solutions made in accordance with the method of the present invention are used as etching agents for selectively removing organometallic residues or organic silicone residues in plasma etching methods of producing wafers. With regard to this selectivity, the method of the present invention can be particularly advantageously used to control the etch selectivity of solutions by, among other properties, by the addition of additional reactive gases such as hydrogen chloride or hydrogen bromide, as described above.

In another embodiment of the method of the present invention, water can be mixed into the highly pure solution to modify etching selectivity. A considerable advantage of the method of the invention is that the highly-pure solution is anhydrous, e.g. a highly pure ammonium fluoride solution can be produced using gaseous hydrogen fluoride, gaseous ammonia, and anhydrous solvent, so that an extraordinarily precise and reproducible water content can be set by the addition of water after the production of the highly pure solution.

It is also possible to add aqueous solutions of additional components to the solution after producing the anhydrous, highly pure solution of the invention. The advantage is, among others, that the water content of the solution to be produced can be set precisely and based on the anhydrous solution in a single step that also introduces one or more additional components. Examples are, among others aqueous acids such as e.g. phosphoric acid, aqueous hydrochloric acid, or aqueous acetic acid.

In a particularly preferred embodiment of the present invention, at least one substance is added to the anhydrous solvent as an additional component, affecting the surface-active properties, among others, of highly pure solution used as etching agents. Therein, appropriate polar as well as non-polar substances can be used. Examples are, among others, aliphatic or aromatic amines. Aliphatic amines with a chain length of 5 to 12 carbon atoms are preferably used. The amines may be substituted, if necessary for purposes of solubility, wherein OH groups or halogenide residues are possible substituents, among others.

In order to obtain the required degree of purity of the highly pure solution, it may be necessary to purify the substances affecting surface activity prior to use. Herein, essentially any appropriate conventional prior art method may be used.

The following non-limiting examples set forth hereinbelow illustrate certain aspects of the invention. All parts and percentages are by weight unless otherwise noted and all temperatures are in degrees Celsius.

EXAMPLES

Example 1

Production of a Solution of Hydrogen Fluoride in Ethylene Glycol 800 g ethylene glycol was placed in a 1,000 ml batch container. By means of an injector, approx. 80 g anhydrous hydrogen fluoride was condensed and dissolved in the ethylene glycol. Therein, the increase of content of hydrogen fluoride was analytically monitored. The addition of the liquid acid was terminated at a content of 10 weight percent After termination, the solution was recirculated and homogenized for 1 hour by means of a pump-over line. The solution had a metal-ion content of less than 100 ppt per metal.

Example 2

Production of a Solution of Ammonium Fluoride in Ethylene Glycol

A 1,000 ml batching container was nitrogen blanketed for 1 hour. Subsequently, the process as of example 1 was repeated to obtain a solution of HF in ethylene glycol.

Gaseous ammonia was introduced into this solution of HF in ethylene glycol, wherein the molar ratio of ammonia and hydrogen fluoride was 1:1. The temperature was controlled by external cooling and by controlling the ammonia addition rate, so that the temperature did not exceed 30° C.

After introducing the entire amount of ammonia, the solution was recirculated for 30 min with cooling. The resulting solution had a metal-ion content of less than 100 ppt per metal.

Examples 3-6

For Example 3, Example 1 was repeated substituting glacial acetic acid for ethylene glycol. For Example 4, glacial acetic acid was used again as the solvent in a 90:10 weight ratio to HF. (720 g Glacial acetic acid, 80 g HF.) Examples 5 and 6 repeated Example 4 using 80:20 and 70:30 weight ratios of glacial acetic acid to HF. (640 g Glacial acetic acid and 160 g HF; and 560 g glacial acetic acid and 240 g HF, respectively.)

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and script of the invention, and all such variations are intended to be included within the scope of the following claims.

What is claimed is:

1. A method for producing a highly pure solution consisting of hydrogen fluoride in at least one anhydrous solvent, said method comprising:
    adding anhydrous hydrogen fluoride with a metal ion content less than 1 part per billion (ppb) per metal, into at least one anhydrous solvent, wherein each solvent has an impurity content less than 1 ppb; and
    homogenizing by recirculation the hydrogen fluoride and solvent;
    wherein said hydrogen fluoride is added by means of an injector into said solvent in the form of a gas, or as a liquefied gas, or as a mixture of a gas and a liquefied gas.

2. The method according to claim 1, wherein at least one anhydrous solvent is a polar solvent.

3. The method according to claim 1, wherein at least one anhydrous solvent is selected from the group consisting of polyols, carboxylic acids, derivatives of carboxylic acids, organic sulfur compounds, aliphatic or aromatic nitrogen compounds, and mixtures of two or more thereof.

4. The method according to claim 3, wherein at least one anhydrous solvent is acetic acid.

5. A method for producing a highly pure ammonium fluoride solution comprising:

adding into at least one anhydrous solvent anhydrous gaseous ammonia with a metal ion content less than 1 part per billion (ppb) per metal and anhydrous hydrogen fluoride with a metal ion content less than 1 ppb per metal, wherein each solvent has a total impurity content less than 1 ppb, and said ammonia and said hydrogen fluoride are added in amounts effective to provide a solution with an ammonium fluoride concentration between about 0.1 and about 50 percent by weight; and homogenizing by recirculation said ammonium fluoride solution;

wherein said hydrogen fluoride is added by means of an injector into said solvent in the form of a gas, or as a liquefied gas, or as a mixture of a gas and a liquefied gas.

6. The method according to claim 5, wherein at least one anhydrous solvent is DMA, DMSO or a mixture thereof.

7. A method for producing a highly pure acid etching solution comprising:

adding into at least one anhydrous solvent, anhydrous gaseous hydrogen chloride or anhydrous gaseous hydrogen bromide or a mixture thereof each with a metal ion content of less than 1 part per billion (ppb) per metal and anhydrous hydrogen fluoride with a metal ion content less than 1 ppb per metal, wherein each solvent has a total impurity content less than 1 ppb, and said hydrogen fluoride and hydrogen chloride and/or hydrogen bromide are in amounts effective to provide a solution with a stoichiometric ratio of hydrogen fluoride to hydrogen bromide and/or hydrogen chloride less than or equal to one; and homogenizing by recirculation said solution;

wherein said hydrogen fluoride is added by means of an injector into said solvent in the form of a gas, or as a liquefied gas, or as a mixture of a gas and a liquefied gas.

8. The method according to claim 1, wherein the solution has a metal ion content of less than 100 ppt per metal.

9. A high purity solution consisting of hydrogen fluoride in at least one anhydrous solvent, prepared by the method of claim 1.

10. The solution of claim 9, wherein said solvent is acetic acid.

11. The solution of claim 9, further consisting of one or more components selected from the group consisting of water, ammonium fluoride, hydrogen chloride and hydrogen bromide.

12. A high purity solution comprising ammonium fluoride in at least one anhydrous solvent, prepared by the method of claim 5.

13. The solution of claim 12, comprising from about 1 to about 30% by weight of ammonium fluoride.

14. The solution of claim 12, comprising less than about 0.01% by weight of free hydrogen fluoride.

15. The solution of claim 12, wherein said solution comprises DMA, DMSO or a mixture thereof.

16. The solution of claim 9, wherein the solution has a metal ion content of less than 100 ppt per metal.

17. The solution of claim 12, wherein the solution has a metal ion content of less than 100 ppt per metal.

* * * * *